United States Patent [19]

Fukuji

[11] 4,169,226
[45] Sep. 25, 1979

[54] CHANNEL REMOTE CONTROL DEVICE FOR A TELEVISION, RADIO, ETC.

[76] Inventor: Sato Fukuji, 20-13 .2 chome, Nishikojiya Otaku, Tokyo, Japan

[21] Appl. No.: 821,744

[22] Filed: Aug. 4, 1977

[51] Int. Cl.² ............... H04B 9/00; H04N 5/44
[52] U.S. Cl. ........................ 250/199; 358/194
[58] Field of Search .............. 250/199; 358/194; 325/394

[56] References Cited

U.S. PATENT DOCUMENTS

| 3,294,901 | 12/1966 | Stanghi | 358/194 |
| 3,325,593 | 6/1967 | Platt | 358/194 |
| 3,440,427 | 4/1969 | Kammer | 358/194 |
| 3,866,177 | 2/1975 | Kawamata | 250/199 |
| 3,906,366 | 9/1975 | Minami | 250/199 |
| 3,928,760 | 12/1975 | Isoda | 250/199 |

Primary Examiner—Howard W. Britton
Attorney, Agent, or Firm—Donald D. Mon

[57] ABSTRACT

A channel control device for a television, radio etc. comprising light signal transmitting device and light signal receiving device. Said light signal transmitting device send light signal which is more than two pulse and differs according to selected channel. Said light signal receiving device decodes said light signal and generates signal which will drive the shaft of tuner to a desired or selected channel position.

4 Claims, 9 Drawing Figures

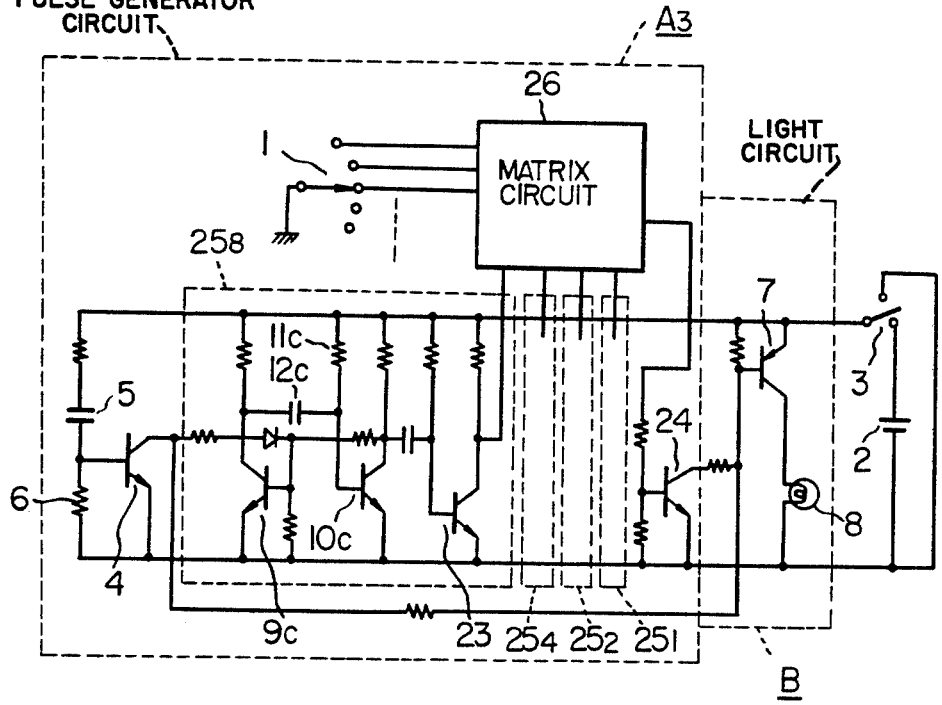
FIG. 7
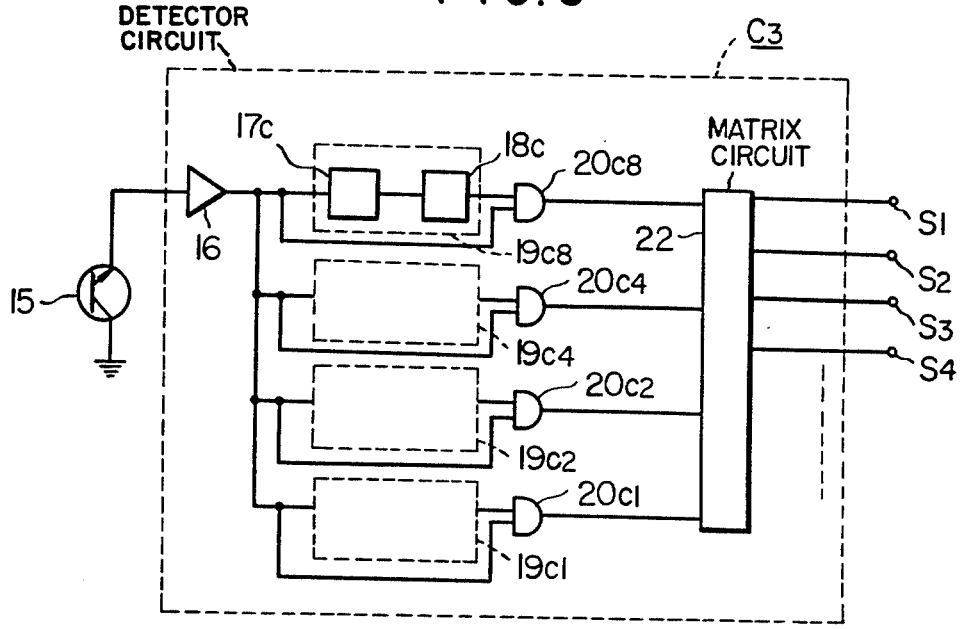
FIG. 8
FIG. 9

CHANNEL REMOTE CONTROL DEVICE FOR A TELEVISION, RADIO, ETC.

A channel control device for a television, radio, etc. comprising a light signal transmitting device and light signal receiving device. Said light signal transmitting device sends a light signal which has more than two pulses and differs according to a selected channel. Said light signal receiving device decodes said light signal pulses and generates a signal which will drive the shaft of a tuner to a desired or selected channel position.

BACKGROUND OF THE INVENTION

The present invention relates to a channel remote control device for television, radio, recorded sound reproducing machines such as a tape recorder, etc.

Heretofore, electric wave or ultra-sonic wave devices were employed for controlling a television channel tuner from a remote position. However, these conventional methods have drawbacks because they produce jamming or noise because they need to repeat the control operation until a desired channel selected is obtained.

The purpose of the present invention is to eliminate said drawbacks and provide a new control device for remote channel selection employing light.

BRIEF SUMMARY OF INVENTION

An object of the present invention is to provide a channel remote control device for television, radio, etc., employing light signals whereby the device produces no jamming or noise.

The second object of the present invention is to provide a channel remote control device for a television, radio, etc. which permits selecting a desired channel by easy operation (i.e. moving a rotary switch and closing a power switch).

The third object of the present invention is to provide a channel remote control device for a television, radio, etc., which eliminates errors due to light noise because a light signal is generated which is more than two pulses long and a detecting circuit of a light signal receiving device decodes the signal.

Other and further objects, features and advantages of the invention will appear more fully in the following description.

Push button switch, slide switch or other kind of switch may be used instead of said rotary switch.

Discharge lamp such as stroboscope light are preferable for the lamp of light signal transmitting device.

BRIEF DESCRIPTION OF THE DRAWINGS

In the Drawing

FIG. 7 is a circuit illustrating a light signal transmitting device of the third embodiment of the present invention;

FIG. 8 is a block diagram and circuit of a light signal receiving device of the third embodiment of the present invention;

FIG. 9 shows a graph illustrating another example of a light signal;

DETAILED DESCRIPTION

Figure 1:
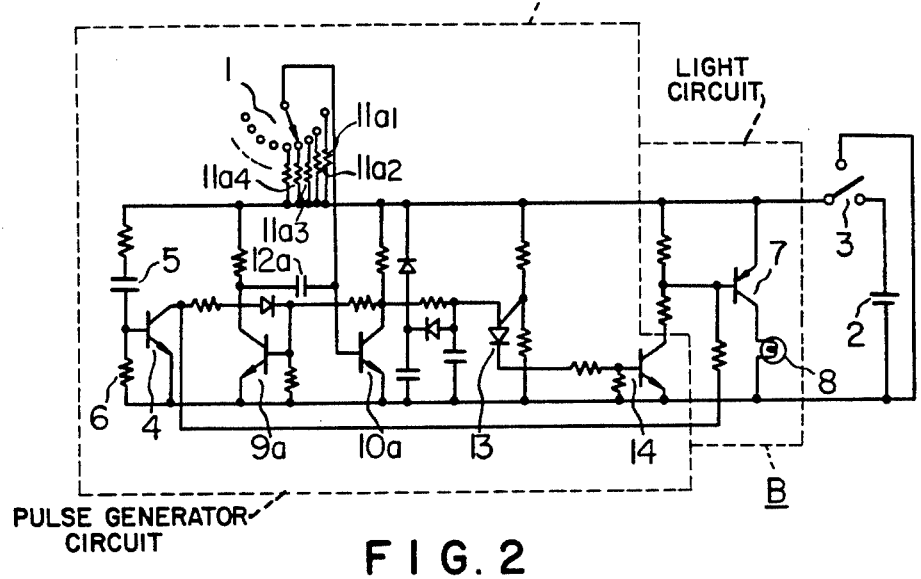
FIG. 1 is a circuit illustrating the light signal transmitting device of the first embodiment of the prevention invention.
Figure 2:
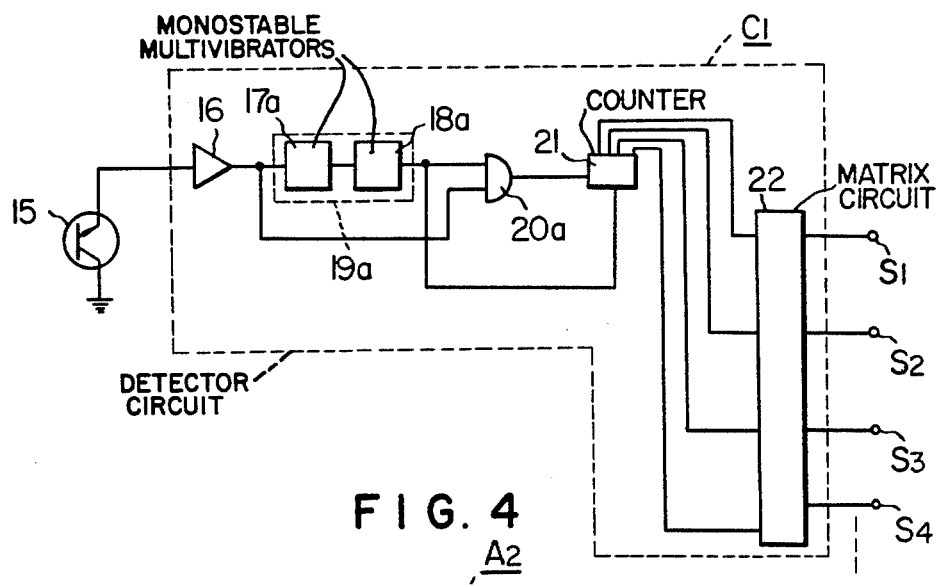
FIG. 2 is a block diagram and circuit of a light signal receiving device of the first embodiment of the present invention.
Figure 3:
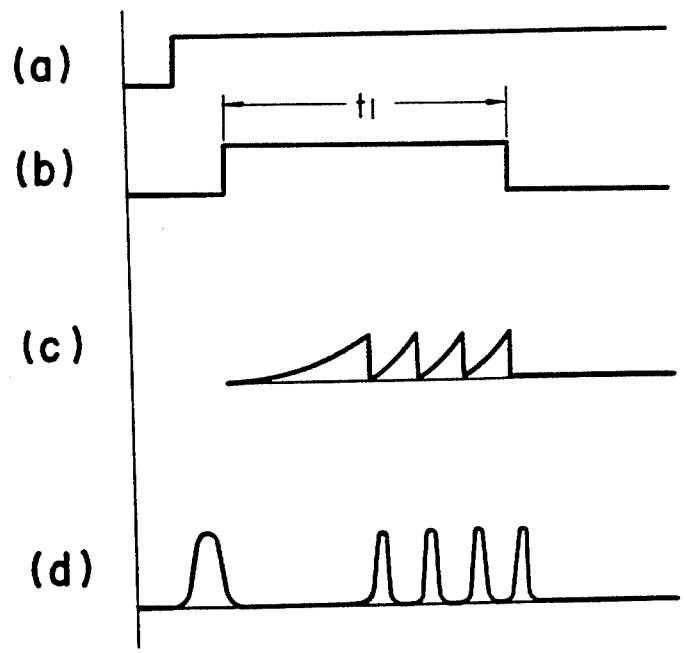
FIG. 3 shows graphs for explaining the operation of the first embodiment of present invention.

Referring to the attached drawings, in FIGS. 1 to 3 inclusive, there is shown the first embodiment of the present invention.

In the FIG. 1, 1 is a rotary switch having fixed contacts corresponding to each channels. 2 is a DC electrical power source, 3 is power switch while 4 is a transistor which is triggered by the voltage of resistor 6 generated by the current through conder 5 and resistor 6 upon closing power switch 3. Transistor 7 turns ON by the turning ON of transistor 4 and lamp 8 emits light by the conduction of the transitor 7.

9a, 10 are transistors connected as a monostable multivibrator and one is ON and the other is OFF at stable state. In this multivibrator, transistor 9a is ON and transistor 10a is OFF upon the turning ON of transistor 4 and the duration of this state is a period corresponding to the time constant of condenser 12a and a resistor 11a1, 11a2 etc. selected by rotary switch 1.

13 is a programable unijunction transistor and controls drive transistor 14 ON or OFF repeatedly by turning ON or OFF when transistor 10a turns OFF. Accordingly, if we change the fixed contact of rotary switch according to the selected channel, the OFF period of transistor 10a of the monostable multivibrator varies according to the selected resistor 11a, which defines the ON and OFF periods of unijunction transistor 13 and lamp 8 turns ON and OFF by a predetermined number corresponding to the selected channel.

As explained above, the light signal transmitting device is constructed from signal generation circuit A1 and light circuit B, in which signal generation circuit A1 generates a predetermined number of pulse signals corresponding to a channel upon the closing of power switch 3 and the switching operation of contacts in rotary switch 1. Light circuit B turns light 8 ON and OFF by a predetermined number which corresponds to the selected channel in said circuit A1.

FIG. 2 shows light signal receiving device which receives a light signal generated by said light signal transmitting device. 15 is photo-electrical transducing element which transduces said light signal into an electrical signal which is amplified by amplifier 16. 19a is a multivibrator circuit comprising first monostable multivibrator 17a and the second monostable multivibrator 18a. The multivibrator circuit 19a is started by the first pulse and its output turns from 0 to 1 by the second pulse. The output turns from 1 to 0 by the duration of a no input period which is determined by a time constant. 20a is an AND gate circuit which receives the output of amplifier 16 and the output of multivibrator 19a while 21 is a counter circuit which counts the output of AND gate circuit 20 only when the output of multivibrator 19a is 1. 22 is a matrix circuit which receives the output of counter circuit 21 and generates a signal S1, S2, etc. according to the selected channel which moves the channel selecting shaft of the television turner to the corresponding channel position.

Said signal receiving device is constructed from a photoelectrical transducing element 15 which transduces a light signal from the signal transmitting device into an electric signal and a detecting circuit C1 which generates a signal S1, S2, etc. for moving the channel selecting shaft of a television to the desired channel position.

The operation of said devices are as follows: for example, if we hope to select channel 4, rotary switch 1 is rotated to a contact which corresponds to channel 4 and power switch 3 is closed as shown in FIG. 3(a). Transistor 4 would turn ON and lamp 8 would turn ON and OFF repeatedly as shown in FIG. 3(d) through transistor 7. When transistor 4 turns on, transistors 9a and 10a turn ON and OFF respectively and this state continues during time t1 which is determined from the time constant of resistor 11a4 connected to said selected contact and condenser 12, as shown in FIG. 3(b). Said programable unijunction transistor 13 repeats the ON and OFF during time t1 (i.e. OFF period of transistor 10a) and transistor 14 and 7 also repeates the ON and OFF and lamp 8 is turned on after the secondary pulse, during time t1.

Therefore the OFF period t1 of transistor 10a varies according to the value of resistor 11a1, 11a2 etc. respectively. The number of ON and OFF periods of transistor 13 (i.e. the number of pulses of lamp 8 corresponds to each channel), and lamp 8 generates the predetermined number of pulses as shown FIG. 3(d) which corresponds to channel 4.

A photo-electrical element transduces the light signal pulses shown in FIG. 3(d) into an electrical signal. This electrical signal is amplified by amplifier 16, with the first pulse applied to multivibrator circuit 19a, then the secondary pulse is applied and output of the multivibrator turns from 0 to 1. Thereby, the gate of AND circuit 20a is held open by the output of circuit 19a, during the period of 1, which is a predetermined length decided by the time constant of the circuit. A predetermined number of pulses from amplifier 16 corresponding to a channel pass through the AND circuit 20a, and is counted at counter circuit 21. For example if the counter 21 is an 8421 code system the counter generates a 0100 signal in the case of channel 4, and a 001 signal in the case of channel 3. Different signals are generated from the counter circuit in the case of other channels in much the same manner, which is a binary digit code system selected from the 8421 code and corresponding to a selected channel. This code signal is decoded at matrix circuit 22 and it generates a signal S4 in the case of channel 4.

As explained above when we operate the rotary switch according to a desired channel, and close power switch 3, a light signal of a predetermined number of pulses is emitted from the light signal transmitting device; the light signal is transduced into an electrical signal at a light signal receiving device, and a signal corresponding to the selected channel is obtained from the output of detecting circuit C1, the drive motor of a channel selecting shaft of a television is driven by the signal and a desired channel is selected. The method for controlling the drive motor and stopping mechanism are well known in prior art and detailed explanation of the method is eliminated from this specification.

Figure 4:
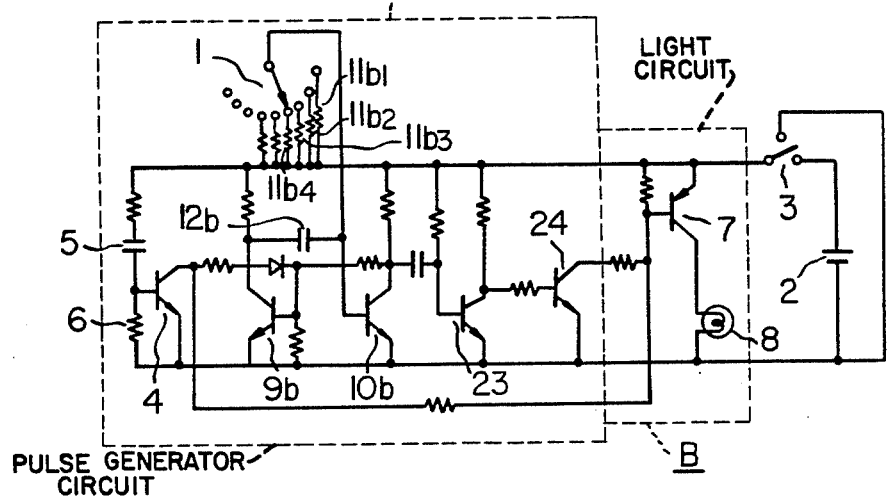
FIG. 4 is a circuit illustrating a light signal transmitting device of the second embodiment of the present invention.

FIG. 4 shows a light signal transmitting device of a secondary embodiment of the present invention, and similar parts of the device shown in FIG. 1 are shown in the same numeral.

In this secondary embodiment, when transistor 10b of the monostable multivibrator turns from ON to OFF, transistor 23 turns to OFF, transistor 24 and transistor 7 turn to ON, and lamp 8 generates light pulses. The interval t2 between the first pulse and second pulse may be varied according to the selected channel. A2 shows the pulse generation circuit.

Figure 5:
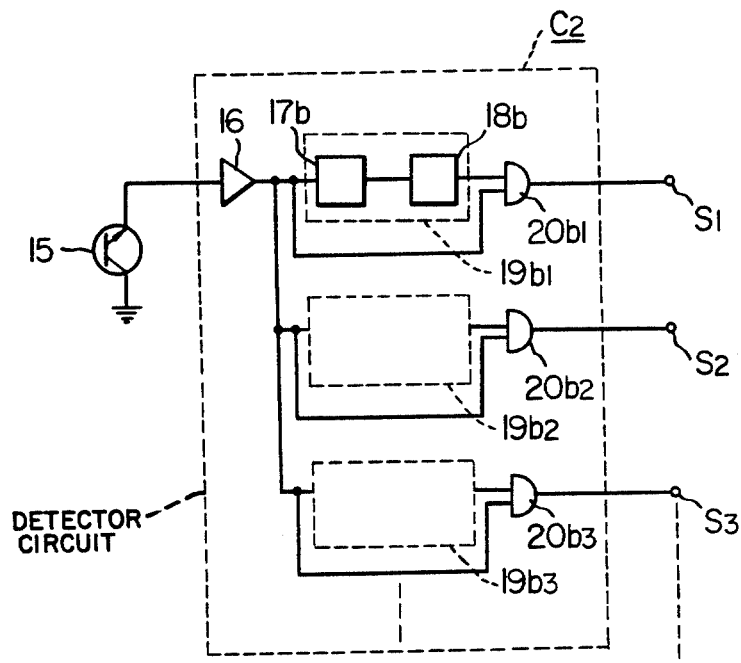
FIG. 5 is a block diagram and circuit of a light signal receiving device of the second embodiment of the present invention.

FIG. 5 shows a light signal receiving device for receiving the light signal generated from said device shown in FIG. 4. 15 is a photo-electric transducing element, 16 is an amplifier, 19b1, 19b2 etc. are multivibrators corresponding to each channel and their time constant differs from each other. 20b1, 20b2 etc. are AND circuits and generate signals S1, S2 etc. which drive the tuning shaft of a television to a desired channel position. Amplifier 16, multivibrator 19b1, 19b2 etc. and AND circuit 20b1, 20b2 etc. comprise a detecting circuit c2 which amplifies and selects the electric signal from photo-electric transducing element 15 and generate signals S1, S2, etc. which drives the shaft of a television tuner to the desired selected channel position.

The operation of said device is as follows: For example if we hope to select channel 4, rotary switch 1 is rotated to a a fixed contact corresponding to said channel, and power switch 3 is closed. Transistors 4 and 7 turn ON, causing lamp 8 to emit light. By turning transistor 4 ON, transistor 9b turns ON and transistor 10b turns OFF. The time for transistor 10b to turn OFF is determined by the time constant of the resistors 11b1, 11b2, etc. which are connected to said selected contact of rotary switch 1, and condenser 12b. Said transistor 10b turns to OFF after time t2 which is determined by the time constant from the first emiision of light. Transistor 23 turns OFF and transistors 24 and 7 turn ON, causing lamp 8 to generate light.

Figure 6:
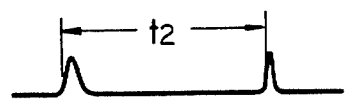
FIG. 6 shows a graph illustrating one example of a light signal.

Thus the lamp generates two pulses of interval t2 as shown in FIG. 6, which interval t2 differs according to the selected channel.

The light signal as shown in FIG. 6 is received by photo-electrical element 15 and transduced into an electric signal, which is amplified by amplifier 16 and added to each multivibrator 19b1, 19b2, etc. Only one of said multivibrators 19b1, 19b2, etc. having a time constant the same as said interval t2 generates signals S1, S2, etc. In the case of channel 4, multivibrator circuit 19b4 generates a signal S4. By this signal S4 the tuner of a television selects channel 4.

As explained above, by operating rotary switch 1 a channel, and closing power switch 3, a light signal having an interval corresponding to the selected channel is emitted; detecting circuit C2 generates a signal corresponding to selected channel, and the tuner of television is switched to the desired channel.

FIG. 7 shows a light signal transmitting device of the third embodiment of the present invention, with same numeral as FIG. 4 indicating the same function. $25_1$, $25_2$, etc. are pulse generating circuits of a 8421 code system, and have different time constants from each other. 26 is a matrix circuit generation a pulse corresponding to the designated channel selected by rotary switch 1 combining the output of pulse generating circuits $25_1$, $24_2$, etc. Transistors 24, 7 are turned ON by the output pulse of said matrix circuit 26 and cause light to emit from lamp 8. A3 indicates the signal generating circuit.

FIG. 8 shows a light signal receiving device for receiving the light signals from the device shown in FIG. 7. 15 is a photo-electric transducer and 16 is an amplifier as explained before. 19c1, 19c2, etc. are multivibrator circuits of a 8421 code system and have the same function as explained previously, with each having a different time constant. 20c1, 20c2, etc. are AND circuits, and 22' is a matrix circuit which receives the output of the AND circuits and generates signals S1, S2, etc. which drive the tuner shaft of a television to a desired position according to the selected channel. Amplifier 16, multivibrator circuits 19c1, 19c2 etc., AND circuits 20c1, 20c2, etc. and matrix circuit 22' comprise the detecting circuit C3 which processes the signal from the photoelectrical transducer element 15 according to the selected channel and generates signals S1, S2, etc. to the drive shaft of a television tuner to a desired selected position.

The operation of said device is as follows: For example if we hope to select channel 3, the rotary switch is rotated to a fixed constact which corresponds to channel 3, power switch 3 is closed, transistors 4 and 7 turn ON, causing lamp 8 to emit light. By turning transistor 4 ON, said pulse generating circuit $25_1$, $25_2$, etc. generates pulses which start at different times from each other, however, only one of the pulse generating circuits corresponding to channel 3 selected by rotary switch 1, is combined with matrix circuit 26, and the combined pulse is delivered to the base of transistor 24, thereby turning transistors 24 and 7 ON causing lamp 8 to emit pulses of light as shown in FIG. 3.

The light signal shown in FIG. 9, is received by the photo-electric transducing element 15 producing a pulse electric signal, which is amplified by amplifier 16, then applied to each multivibrator 19c1, 19c2, etc. In the case of channel 3, only circuits 19c2, 19c1 operate and the AND circuit generates a signal received by matrix 22 which generates signal S3 corresponding to channel 3. This signal S3, causes the channel of a television to be changed and channel 3 selected.

As explained above, by operation of rotary switch 1 a channel, and closing power switch 3, a light signal having a combination corresponding to the selected channel is emitted. Detecting circuit C3 receives and processes the emitted light signal generates a signal corresponding to selected channel, and the tuner of a television is switched to the desired channel.

In the present invention the lamp may be a light emitting diode.

As explained above, in the present invention a light signal transmitting devices comprised of a lamp or light emitting diode, and a signal generating circuit generates light pulses according to the channel, a light signal transmitted from the light signal generating circuit is received and processed into an electrical signal by a photo-electric element, the electric signal is selected according to the channel selected and a signal which drives a television tuner to desired channel position is generated by a detecting circuit of the light signal receiving device, whereby error due to light noise is prevented, permitting a desired channel to be selected by easy operation of a moving rotary switch and closing of a power switch.

What is claimed is:

1. A channel remote control device for a television, radio etc, comprising a light signal transmitting device having a pulse signal generating circuit which generates two or more light pulses corresponding to each channel desired by operation of a channel selecting switch and closing of a power switch, a light circuit transmitting said lights pulses being energized by the output of said light signal generating circuit; a light signal receiving device having a photo-electrical transducing element for receiving said light pulses emitted from said light circuit, a detecting circuit receiving the output of said transducing element, said detecting circuit producing an electrical signal according to the selected channel, and signal generating means receiving the output of said detecting circuit for driving the shaft of a tuner to the desired channel position.

2. A channel remote control device for television, radio etc as claimed in claim 1 in which the period between the first pulse and second pulse of said light signal differs according to the selected channel.

3. A channel remote control device for television, radio etc as claimed in claim 1 in which the period between the first pulse and the last pulse of said light signal differs according to the selected channel, whereby the number of pulses corresponds to a selected channel.

4. A channel remote control device for television, radio etc as claim in claim 1, in which the combination of pulses from said pulse generating circuit corresponds to the selected channel, said detector circuit including a plurality of multivibrator circuits; each pulse operating a single multivibrator circuit, and a matrix circuit receiving the output of the multivibrator circuits operated whereby said matrix circuit produces an output signal for driving the shaft of a tuner to the desired channel position.

* * * * *